United States Patent
Watson

(10) Patent No.: US 6,937,911 B2
(45) Date of Patent: Aug. 30, 2005

(54) COMPENSATING FOR CABLE DRAG FORCES IN HIGH PRECISION STAGES

(75) Inventor: Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 134 days.

(21) Appl. No.: 10/100,748

(22) Filed: Mar. 18, 2002

(65) Prior Publication Data

US 2003/0173556 A1 Sep. 18, 2003

(51) Int. Cl.[7] .............................................. G05B 19/18
(52) U.S. Cl. ............................... 700/60; 700/1; 700/56; 700/121
(58) Field of Search ................................ 700/60–61, 1, 700/121, 28, 32, 35, 54, 56, 71, 77; 318/649; 73/866.5; 385/128, 100; 74/490.09, 490.13; 355/72, 75, 77; 901/16; 198/346.1, 346.2, 346.3

(56) References Cited

U.S. PATENT DOCUMENTS

| | | | | |
|---|---|---|---|---|
| 4,410,951 A | * | 10/1983 | Nakamura et al. ........... 700/302 |
| 4,525,659 A | * | 6/1985 | Imahashi et al. ............ 318/649 |
| 4,891,526 A | * | 1/1990 | Reeds .................... 250/442.11 |
| 4,924,257 A | * | 5/1990 | Jain ............................ 355/53 |
| 5,121,898 A | * | 6/1992 | Yasuda et al. ............... 248/550 |
| 5,227,948 A | * | 7/1993 | Boon et al. .................. 361/144 |
| 5,508,518 A | * | 4/1996 | Kendall .................... 250/492.2 |
| 5,623,853 A | * | 4/1997 | Novak et al. ............. 74/490.09 |
| 5,812,396 A | * | 9/1998 | Kato ............................ 700/61 |
| 5,812,420 A | * | 9/1998 | Takahashi ................... 700/280 |
| 5,909,272 A | * | 6/1999 | Osanai et al. ................. 355/53 |
| 5,940,789 A | * | 8/1999 | Yuan ........................ 702/150 |
| 5,982,128 A | * | 11/1999 | Lee ....................... 318/568.16 |
| 5,996,437 A | * | 12/1999 | Novak et al. ............. 74/490.09 |
| 6,008,610 A | * | 12/1999 | Yuan et al. ................. 318/592 |
| 6,069,417 A | * | 5/2000 | Yuan et al. .................... 310/12 |
| 6,130,490 A | * | 10/2000 | Lee ............................. 310/12 |
| 6,134,981 A | * | 10/2000 | Novak et al. ............. 74/490.09 |
| 6,222,614 B1 | * | 4/2001 | Ohtomo ....................... 355/53 |
| 6,323,935 B1 | * | 11/2001 | Ebihara et al. ............... 355/53 |
| 6,363,809 B1 | * | 4/2002 | Novak et al. ............. 74/490.09 |
| 6,584,367 B1 | * | 6/2003 | Makino et al. ............... 700/60 |
| 6,693,402 B2 | * | 2/2004 | Ebihara et al. ............. 318/649 |
| 2004/0158427 A1 | * | 8/2004 | Binnard et al. ............. 702/169 |

FOREIGN PATENT DOCUMENTS

EP          1018669 A2  *  7/2000    ............. G03F/7/20

* cited by examiner

*Primary Examiner*—Anthony Knight
*Assistant Examiner*—Ronald D. Hartman, Jr.
(74) *Attorney, Agent, or Firm*—Beyer Weaver & Thomas LLP

(57) ABSTRACT

A positioning system is disclosed. The positioning system includes a movable stage. The positioning system also includes a cable carrier movable relative to the stage. The cable carrier is configured for carrying a cable so as to prevent cable drag forces from acting on the stage.

12 Claims, 9 Drawing Sheets

COMPENSATING FOR CABLE DRAG FORCES IN HIGH PRECISION STAGES

BACKGROUND OF THE INVENTION

The present invention relates generally to precision motion devices. More particularly, the present invention relates to precision stages configured for moving or carrying an object to be processed. Even more particularly, the present invention relates to techniques for preventing performance degrading forces from acting on a high precision stage.

High precision stages for moving an object to be processed are generally well known. These stages are typically used in manufacturing and inspection machines where precise movements are needed to position an object. The movements may include moving the stage to a fixed position or moving the stage over a specific trajectory, e.g., scanning or step/repeat. By way of example, high precision stages have been introduced and employed to various degrees to position a substrate such as a reticle, mask and/or wafer in semiconductor processing equipment. Semiconductor processing generally requires precise tolerances in order to achieve finer geometries and therefore the stages must be capable of precisely locating the substrate relative to the processing part of the equipment. For example, the processing part may be an inspection system for inspecting the surface of the substrate or a lithography system for writing a circuit image onto a wafer. As should be appreciated, an out of position or mis-aligned substrate may cause errors in inspecting or writing, especially with the extreme level of accuracy that is sought with today's ever shrinking circuit dimensions.

Many high precision stage designs require cables and hoses to be attached to the moving part of the stage. Cables are typically required for actuator power, sensor signals and the like. Hoses, on the other hand, are frequently required for cooling actuators or work pieces, providing pressurized air or fluid for aerostatic or hydrostatic bearings, providing vacuum or return fluid for the same bearings, or providing vacuum for work piece chucking. By way of example, FIG. 1A illustrates a simplified diagram of a prior art stage system 10 for moving a work piece 11. Stage system 10 typically includes a stage 12 that is movably coupled to a guide surface 13 of a rigid structure 14 and linearly positioned by a drive mechanism 16. As shown, the drive mechanism 16 provides a force F for driving the stage 12 back and forth. Furthermore, a plurality of cables and hoses 18 are attached between the rigid structure 14 and the stage 12 so as to connect external devices (not shown) to the moving stage 12. For example, the cables may be electrical cables or fiber optic cables and the hoses may be cooling hoses, air hoses or vacuum hoses. Typically, such cable/hose assemblies are pushed and pulled by the movement of the stage.

By way of another example, FIG. 1B illustrates a simplified dual stage system 20 that includes both a coarse stage 22 and a fine stage 24 for moving a work piece 11. As the names suggest, the coarse stage makes large movements with low positioning accuracy while the fine stage makes small movements with high positioning accuracy. The coarse stage 22 is movably coupled to a guide surface 13 of a rigid structure 14 and linearly positioned by a first drive mechanism 26. The fine stage 24, on the other hand, is located on the coarse stage 22 and independently controlled via a second drive mechanism 28. As shown, the first drive mechanism 26 provides a force $F_1$ for driving the coarse stage 22 back and forth and the second drive mechanism 28 provides a force $F_2$ for driving the fine stage 24 back and forth. Furthermore, a plurality of first cables and hoses 34 are attached between the rigid structure 14 and the coarse stage 22 so as to connect external devices to the moving coarse stage 22, and a plurality of second cables and hoses 36 are attached between the coarse stage 22 and fine stage 24 so as to connect first cable and houses 34 to the moving fine stage 22. The travel between the coarse stage and the rigid structure is typically large and therefore the length of the first cable and hoses 34 are also large. The travel between the fine stage and the coarse stage is typically small and therefore the length of the second cables are also small.

Unfortunately, the cables and hoses, which are attached to the coarse stage and/or the fine stage, may impose a significant amount of drag and mechanical forces, both steady and impulsive, on the moving stage, thus degrading achievable performance. The forces may arise from the acceleration and de-acceleration of the stage (e.g., 4 g), the bending of cables or hoses, friction between adjacent cables or hoses, crossing of cables or hoses, the flexible dynamics of the hose and/or cables, i.e., some are relatively stiff, and the like. Some components of these forces are predictable and repeatable, and some components are not. As should be appreciated, these forces act as disturbances (both linearly and non-linearly) that may disturb the desired stage movement. For example, these forces may disturb the motion of the stage by pulling or pushing on the stage thus increasing settling times of the stage or producing excessive vibrations in the stage.

In the case that the instrument or machine is an ordinary machine tool, it is not necessary to consider the influence of such disturbances on the machine. However, in the case that the instrument is a high precision tool such disturbances give a fatal influence to those instruments. For example, in lithography systems, which require high positioning accuracy of the stage while moving, these cable and hose disturbances may impact the achievable accuracy of the stage and thus they may cause degradation in pattern placement and accuracy.

Accordingly, there have been some efforts to prevent drag and mechanical forces from acting on high precision stages, and more particularly on high precision stages used in lithography systems such as optical lithography and electron beam projection lithography. One solution has been to provide a stage system that includes both a coarse stage and a follower stage. The coarse stage moves the object to be processed to the desired processing location while the follower stage, following the coarse stage, carries the cable and hoses.

By way of example, FIG. 1C illustrates a simplified stage system 40 that includes both a stage 42 for moving a work piece 11 and a follower stage 44 for carrying a plurality of first cable and houses 46. Both stages 42, 44 are movably coupled to a guide surface 13 of a rigid structure 14 (i.e., stage frame). The stage 42 is linearly positioned by a first drive mechanism 50 and the follower stage 44 is linearly positioned by a second drive mechanism 52. As shown, the first drive mechanism 50 provides a force $F_1$ for driving the stage 42 back and forth and the second drive mechanism 52 provides a force $F_2$ for driving the follower stage 44 back and forth. Further, a plurality of first cables and hoses 46 are attached between the rigid structure 14 and the follower stage 44 so as to connect external devices to the moving follower stage 44, and a plurality of second cables and hoses 48, which are shorter than the first cable and hoses 46, are attached between the follower stage 44 and coarse stage 42 so as to connect first cable and houses 46 to the moving coarse stage 42. As should be appreciated, most of the cable drag forces act on the follower stage (e.g., long cables) and thus the disturbance forces on the coarse stage are due only to the small position differences between the coarse stage and the follower stage.

Although such designs work well, there are continuing efforts to improve techniques for preventing performance degrading forces from acting on a high precision stage. By way of example, in certain situations, it may not be desirable to have a follower stage. Follower stages, for example, typically require long travel bearings and actuators, which in turn requires additional space, power, and cost.

SUMMARY OF THE INVENTION

The invention relates, in one embodiment, to a positioning system. The positioning system includes a movable stage. The positioning system also includes a cable carrier movable relative to the stage. The cable carrier is configured for carrying a cable so as to prevent cable drag forces from acting on the stage.

The invention relates, in another embodiment, to a high precision stage system. The system includes a movable stage. The system also includes a cable carrier movably coupled to the stage. The system further includes a control system for controlling the positions of the stage and cable carrier so as to prevent cable drag forces from acting on the stage.

The invention relates, in another embodiment, to a method for preventing cable drag forces from acting on a stage. The method includes providing a cable carrier that is movably coupled to the stage. The cable carrier is configured for carrying a cable that is operatively coupled to a device external to the stage. The method also includes applying a first force to the cable carrier so as to cancel the cable drag forces acting on the cable carrier. The method further includes applying a second force to the stage so as to move the stage and to cancel the first force acting on the stage.

DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order not to unnecessarily obscure the present invention.

The invention generally pertains to precision stages configured for moving or carrying an object to be processed. More particularly, the invention pertains to a stage system for preventing performance degrading forces from acting on a high precision stage. One aspect of the invention relates to a cable carrier that is movable relative to a stage. Another aspect of the invention relates to techniques for canceling or otherwise compensating for unknown cable drag forces that act directly or indirectly on the stage. The invention is particularly useful in semiconductor processing systems, such as lithography systems and inspection systems, where cable drag forces are a substantial impediment to proper functionality. However, it should be apparent that the invention can be readily applied to a wide variety of high precision tools.

Embodiments of the invention are discussed below with reference to FIGS. 2–10. However, those skilled in the art will readily appreciate that the detailed description given herein with respect to these figures is for explanatory purposes as the invention extends beyond these limited embodiments.

Figure 1A:
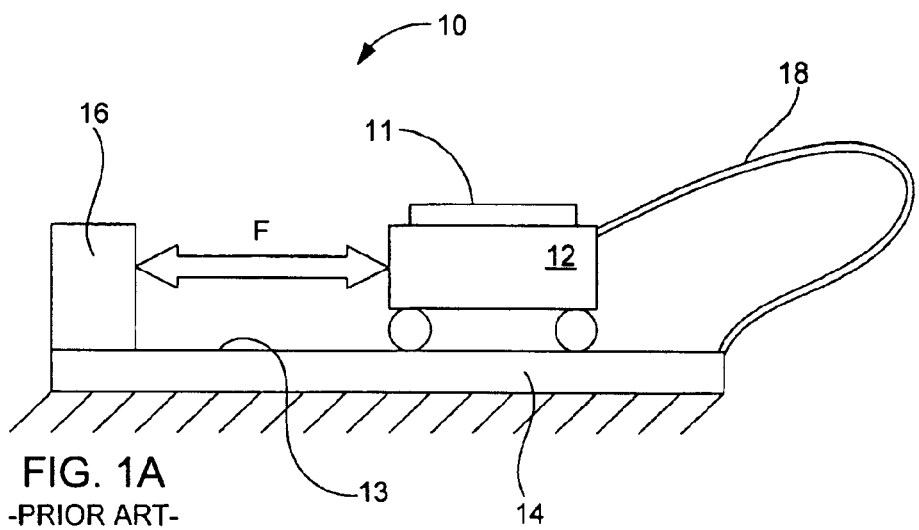
FIG. 1A illustrates a simplified diagram of a stage for moving a work piece.
Figure 1B:
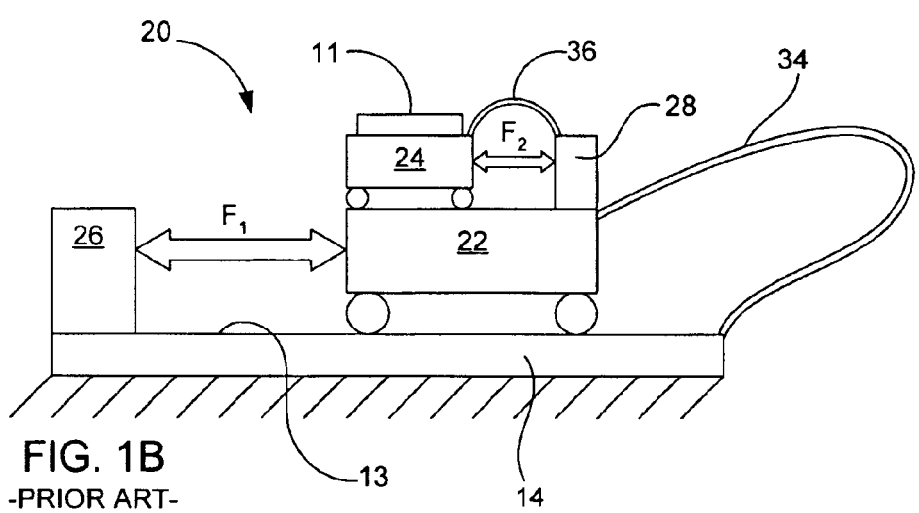
FIG. 1B illustrates a simplified dual stage system that includes both a coarse stage and a fine stage for moving a work piece.
Figure 1C:
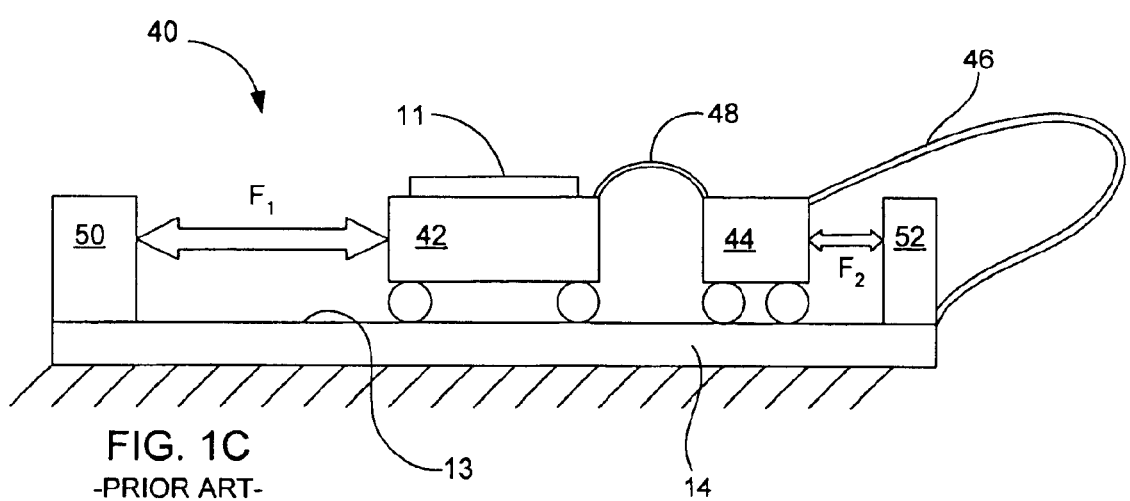
FIG. 1C illustrates a simplified stage system that includes both a coarse stage for moving a work piece and a follower stage for carrying a plurality of cables.
Figure 2:
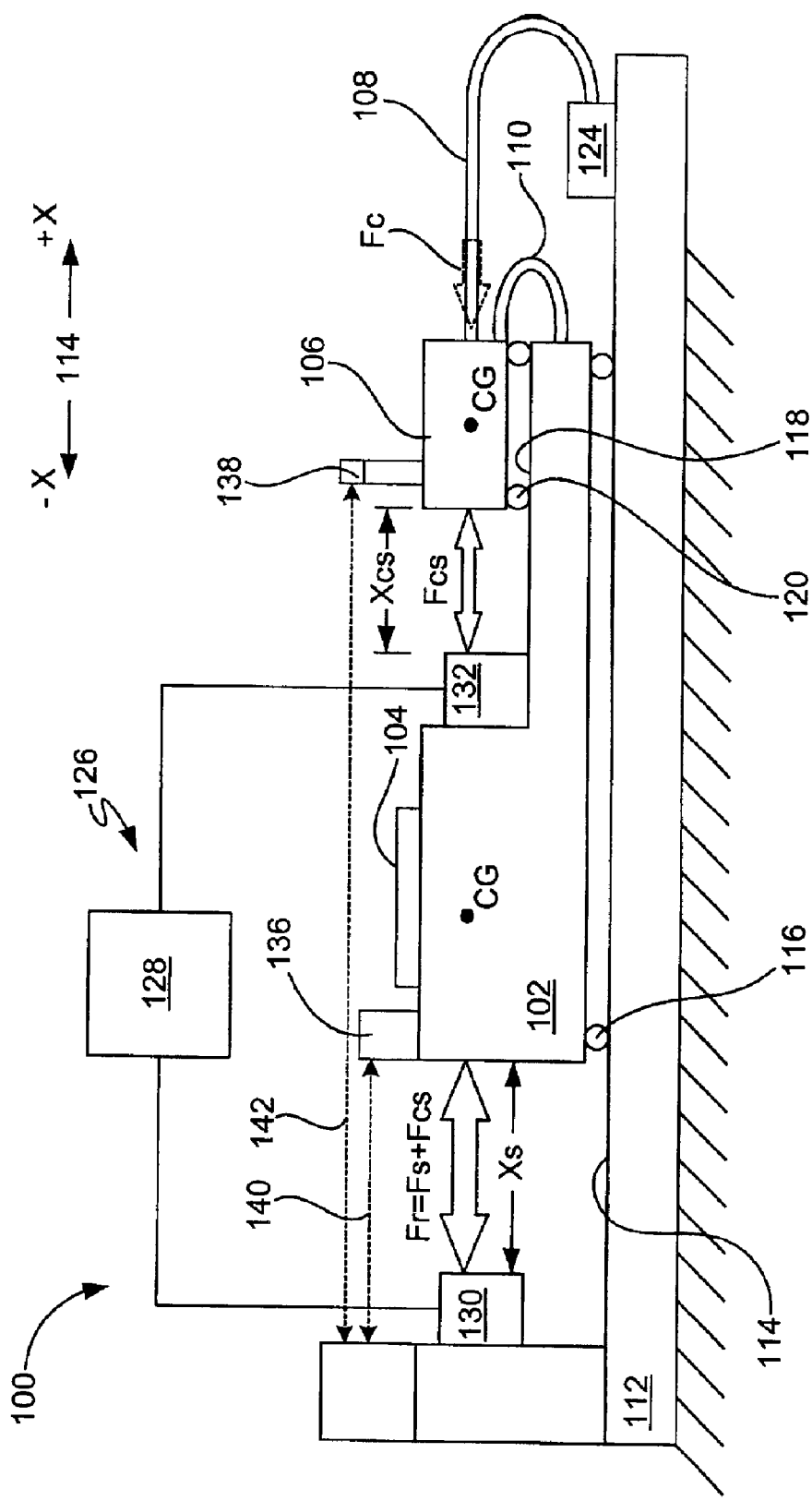
FIG. 2 is a simplified diagram of a stage system 100, in accordance with one embodiment of the present invention.

FIG. 2 is a simplified diagram of a stage system 100, in accordance with one embodiment of the present invention.

In this figure, the dimensions of various components are exaggerated to better illustrate the features of this embodiment. The stage system 100 generally includes a stage 102 for carrying a work piece 104 and a cable carrier 106 for carrying a plurality of first cables 108 and a plurality of second cables 110. The stage 102 is movable relative to a stage body 112, and the cable carrier 106 is movable relative to the stage 102. In most cases, the cable carrier 106 is configured to move independent of the stage 102. Further, both the stage 102 and cable carrier 106 are configured to travel in a linear direction 114 (e.g., X, Y or Z coordinate). In one embodiment, the center of gravity (CG) of the cable carrier 106 moves relative to the center of gravity (CG) of the stage 102. For example, the CG of the cable carrier and the CG of the stage may move along the same axis.

In the embodiment shown, the stage 102 is movably coupled to the stage body 112 (e.g., stage frame) via an anti-friction device 116. By way of example, the anti-friction device 116 may include anti-friction bearings such as air bearings, fluid bearings, roller bearings or the like. Furthermore, the cable carrier 106 is movably coupled to a surface 118 of the stage 102 via a carrier linkage 120. The surface 118 may be a top surface (as shown), a bottom surface or a side surface. In most cases, the carrier linkage 120 is a one degree of freedom linkage such as roller bearings, pivot arm(s), flexure(s), or the like. The carrier linkage 120 will be described in greater detail below.

With regards to the cables, the plurality of first cables 108 are disposed between the cable carrier 106 and an external device 124, and the plurality of second cables 110, which may be operatively coupled to the plurality of first cables 108, are disposed between the cable carrier 106 and the stage 102. In one embodiment, the carrier attachment end of the first cables 108 is positioned substantially on the same axis as the stage CG and the cable carrier CG's line of travel. The first cables 108 have a length that corresponds with the travel of the stage 102, and the second cables 110 have a length that corresponds with the travel of the cable carrier 106. In most cases, the stage travel is larger than the cable carrier travel and therefore the first cables 108 are typically longer than the second cables 110. The external device 124 is typically located external to the stage 102 and may be any component that is used for operating the stage 102 or cable carrier 106. By way of example, the external device 124 may be a power supply, a controller, an air supply, a vacuum generator, a cooling supply, or the like (or any combination thereof). As should be appreciated, the plurality of first cables and second cables are used to operatively couple the external device 124 to the stage 102. By way of example, the first and second cables 108, 110 may be electrical wires, fiber optic cables, coaxial cables or they may be hoses or tubes including air hoses, vacuum hoses or cooling hoses. It should also be appreciated, that these are not limitations and that the cables 108, 110 and external devices 124 can be anything that is needed to effectively operative the stage 102 or something mounted on the stage 102 (e.g., cable carrier 106).

The stage system 100 also includes a position control system 126 configured for controlling the positions of both the stage 102 and the cable carrier 106. The position control system 126 generally includes a position controller 128, a stage drive unit 130 and a carrier drive unit 132. The position controller 128 is operatively coupled to the stage drive unit 130 and the carrier drive unit 132. In general, the position controller 128 provides force command signals for driving the stage drive unit 130 and the carrier drive unit 132. For example, the stage drive unit 130, via a stage force command signal, outputs a force Fs for moving the stage 102, and the carrier drive unit 132, via a carrier force command signal, outputs a force Fcs for moving the carrier 106. In most cases, force Fs is the force required to move the stage 102 to a desired position, i.e., acceleration, scan, deceleration, and force Fcs is the force required to move the cable carrier 106 to a cable carrier position Xcs relative to the moving stage 102.

The first drive unit 130, which is configured for moving the stage 102, generally includes an actuator such as a linear servo-motor, a ball screw motor, a pneumatic motor or the like. Further still, the second drive unit 132, which is configured for moving the carrier 106, generally includes a linear force type actuator such as a voice coil motor (VCM), an E-I core actuator, a pneumatic cylinder, or a rotary force type actuator such as a torque motor or an air motor. A force type actuator is generally preferred because the force output is known. However, it should be noted, that force type actuators are not a limitation and that other actuators may be used so long as the force output can be determined.

Although FIG. 2 shows the signal from position controller 128 going to the stage drive unit 130 mounted on the stage body 112, it should be noted, that the control signal (or power) may also go to a coil or other mover on the stage 102 and the stage drive unit 130 may be a passive stator.

Moreover, to control the accuracy of the stage system 100, the actual positions of the stage 102 and the cable carrier 106 (e.g., Xs and Xcs) are measured by a position measurement system. In the illustrated embodiment, the positioning measurement system represents a laser interferometer system that includes measuring mirrors 136, 138 which are attached in the linear direction 114 to a side of the stage 102 and carrier 106, respectively. The mirrors 136, 138 provide reflective surfaces that enable laser interferometer beams 140, 142 to facilitate positioning measurements with respect to the stage 102 and carrier 106. Because interferometers are differential devices, the positions of the stage 102 and cable carrier 106 are generally measured relative to a reference position of the stage system 100. The reference position may be the stage 102 (only for carrier 106), stage body 112, some other part of the frame that supports the stage system 100 or some component that is external to the stage system 100. In the illustrated embodiment, the reference position for the carrier and the stage is the stage body 112. Furthermore, although not shown, the position measurement system is operatively coupled to the position control system 126. The position measurement system typically provides position signals corresponding to the actual positions of the stage 102 and carrier 106 to the position control system 126. As such, the position control system 126, via actual position signals from the position measurement system, can determine the positional error related to either the stage 102 and/or the carrier 106.

It should be appreciated that laser interferometers are not a limitation and that a wide variety of other position measurement systems can be used. By way of example, encoder sensors, potentiometer sensors, capacitance sensors, inductive sensors, linear scales and the like may also be used to determine the position of the stage and carrier. In one embodiment, a combination of position measuring systems may be used. For example, a laser interferometer system may be used to measure the position of the stage while a capacitance sensor may be used to measure the position of the carrier. As should be appreciated, the stroke of the carrier may be short and thus an elaborate and expensive laser interferometer may not be necessary. Position measurement systems are generally well known to those skilled in the art and for the sake of brevity will not be described in greater detail.

It is assumed in the following description that the forces required to move cables 108 are large because of their length, and the distance and velocity of their motion. It is also assumed that the cables 110 are subject to very little travel or velocity so that the forces required to move them are very small. Therefore, the following description includes only the cable forces from cables 108 and substantially ignores the forces from cable 110. The allowable stroke of Xcs is determined by the allowable forces from cables 110. Thus, if the forces from cables 110 cannot be ignored then these forces should be added to the force Fc from the cables 108.

In accordance with one aspect of the present invention, the stage system 100 is configured to control the forces acting on the stage 102 and the cable carrier 106 in a manner that allows the stage 102 to move without substantially feeling the disturbance of the cable drag forces Fc. Broadly, the carrier force Fcs is applied to the cable carrier 106 to overcome the cable drag forces Fc acting on the carrier. As a result of applying the carrier force Fcs, an opposite reactionary force Fcs acts on the stage 102 through the carrier drive unit 132. In order to overcome the effects of the reactionary force Fcs acting on the stage 102, an additional component equal to Fcs is added to the stage servo force Fs. The combination of the stage force Fs and the force Fcs produces a resultant force Fr, which is applied to the stage 102 to move the stage 102 to its desired position. In effect, the carrier force Fcs replaces the "unknown" cable drag forces Fc that would otherwise act on the stage 102, and the resultant force Fr cancels the "known" carrier force Fcs that now acts on the stage 102 thus leaving the force Fs to move the stage 102 to the desired position.

In the illustrated embodiment, the stage system 100 is configured to control the forces acting on the stage 102 and carrier 106 by using position feedback from the position measuring system. In this embodiment, the position measuring system measures the actual position of the cable carrier 106 relative to the stage 102 and sends a position signal to the control system 126. After receiving the position signal, the control system 126 compares the actual position to a desired carrier position. If there is any deviation between the actual position and the desired carrier position then the control system 126 sends a force command signal to the carrier drive unit 132. By way of example, deviations in the cable carrier position may occur when stage force Fs is applied to the stage 102 to accelerate, scan, or decelerate the stage 102. After receiving the force command signal, the carrier drive unit 132 outputs the force Fcs to move the cable carrier 106 to the desired carrier position Xcs relative to the stage 102.

The "known" force Fcs is configured to work against the "unknown" cable drag forces Fc in order to dynamically maintain a cable carrier position Xcs relative to the moving stage 102. By dynamically maintaining, it is meant that during stage acceleration, scan, and deceleration, the carrier 106 continually adjusts its position in order to sustain the position Xcs within a nominal range (e.g., 0–3 mm). That is, the control loop determines the force Fcs based on the position feedback Xcs in order to try to keep Xcs zero (or constant). The force Fcs varies in time in response to the drag force Fc and the acceleration of the stage. During these adjustments, the force Fcs is configured to overcome the cable drag forces Fc to move the cable carrier to position Xcs, and therefore the cable drag forces Fc, which act opposite to the force Fcs, are effectively canceled. Taken broadly, it can be assumed that if position Xcs remains constant, then force Fcs is equal to Fc. As should be appreciated, using the above mentioned technique, the cable drag forces Fc are canceled without determining their actual value.

Although it is generally desirable to keep Xcs constant, it should be noted that it is not always possible or necessary to do so. For instance, the objective is generally to minimize the stage disturbances whether or not Xcs is held constant. In an alternate embodiment, therefore, the carrier 106 maybe configured to continually adjusts its position within a nominal range, i.e., some relative movement (+/−) from a constant or zero Xcs may be accepted (e.g., ±0–3 mm).

The ability of the servo loop to maintain a desired Xcs position, whether a constant position or a position within a specific range, generally depends on the disturbance characteristics and the servo loop bandwidth. In the configuration described, the two main sources of disturbances come from the short cable (110 in FIG. 2) and the carrier force, Fcs. The disturbance through the short cable generally depends on the relative amplitude and velocity of the carrier verses the stage. It also depends on the cable stiffness, etc. The carrier force Fcs is preferably cancelled by the additional force added to Fs for the stage. However, these forces will never match perfectly, especially at higher frequencies. Also, higher frequency forces may tend to excite flexible modes in the stage. Therefore, from this point of view, it is best if the force Fcs forces are smooth and relatively slow varying. This implies a low bandwidth position feedback, which results in a larger "error" in Xcs position.

It should be noted that as the carrier 106 moves relative to the stage 102, disturbance forces from the cable 110 may also act on the stage 102. The allowable position Xcs and velocity of Xcs may depend on the magnitude of this disturbance.

In addition to measuring the position of the cable carrier 106, the position measuring system also measures the actual position of the stage 102 and sends a position signal to the control system 126. If there is any deviation between the actual position and the desired stage position then the stage servo control system 126 computes the desired stage servo force Fs. The controller then adds the carrier command signal (Fcs) to the stage servo force command signal (Fs) and the resultant command signal is sent to the stage drive unit 130. After receiving the resultant force command signal, the stage unit 130 outputs the force Fr, which is the combination of Fcs and Fs, to move the stage 102 to the desired stage position. As should be appreciated, the carrier force Fcs is combined with the stage force Fs in order to cancel the reaction force Fcs of the moving carrier on the moving stage.

Figure 3A:
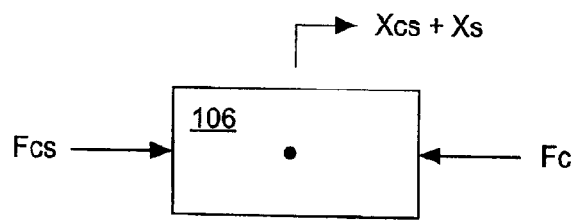
FIG. 3A is a free body diagram illustrating the forces acting on the cable carrier during movement of the stage, in accordance with one embodiment of the present invention.
Figure 3B:
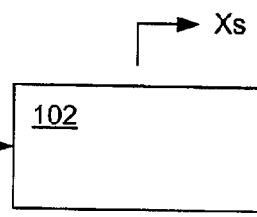
FIG. 3B is a free diagram illustrating the forces acting on the stage during movement of the stage, in accordance with one embodiment of the present invention.

To facilitate discussion, FIG. 3A is a free body diagram illustrating the forces acting on the cable carrier 106 during movement of the stage 102, and FIG. 3B is a free diagram illustrating the forces acting on the stage 102 during movement of the stage 102. As is generally well known, the purpose of a free body diagram is to evaluate the resultant of all actual forces acting on a body in question. In these diagrams, it is assumed that the stage 102 and carrier 106 move with negligible friction and that all the forces (e.g., Fr, Fc, Fcs and Fs) are directed through the center of gravity (CG) of the stage. With regards to FIG. 3A, in order to maintain position Xcs, the force exerted on the cable carrier 106 by the cables is equal to the force exerted on the cable carrier 106 by the carrier drive unit. The sum of the forces in FIG. 3A is generally provided by the equation $\Sigma F = Fc - Fcs = m_c (\ddot{X}cs + \ddot{X}s)$, where Fc and Fcs are the forces of the cables and carrier, respectively, $m_c$=the mass of the carrier, $\ddot{X}s$=the acceleration of the stage through Xs, and $\ddot{X}cs$=the acceleration of the carrier through Xcs. In the case where the system maintains a constant Xcs, $\ddot{X}cs \approx 0$ and thus Fc−Fcs= $m_c \ddot{X}s$ (because $m_c$ is accelerated along with the stage). Ideally, $m_c$ is small and thus Fcs≈Fc.

The free body diagram shown in FIG. 3B, on the other hand, discloses a force differential in the direction 114 where the force outcome is equal to force Fs. That is, in order to maintain the desired force Fs for moving the stage 102, a resultant force Fr, which includes force Fs and Fcs, is applied to the stage 102 by the stage drive unit to cancel the force Fcs exerted on the stage 102 by the moving cable carrier 106. The sum of the forces in FIG. 3B is thus ΣF=Fr−Fcs=Fs where Fr=Fs+Fcs.

Figure 4A:
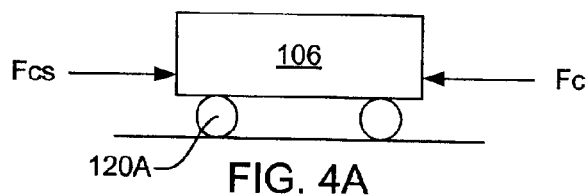
FIG. 4A illustrates a cable carrier that is movably coupled to the surface of the stage via roller bearings, in accordance with one embodiment of the present invention.
Figure 4B:
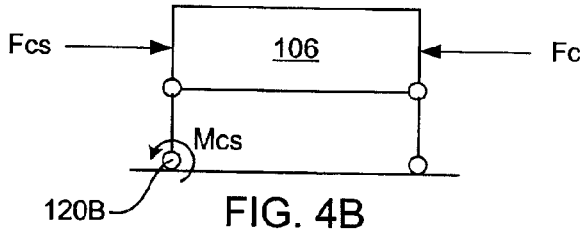
FIG. 4B illustrates a cable carrier that is movably coupled to the surface of the stage via pivot arms, in accordance with one embodiment of the present invention.

FIGS. 4A–4E are simplified side view diagrams of the cable carrier 106 and carrier linkage 120, in accordance with several embodiments of the present invention. FIG. 4A illustrates a cable carrier 106 that is movably coupled to the surface 118 of the stage 102 via roller bearings 120A. The roller bearings 120A allow the cable carrier 106 to freely slide along the surface 118 of the stage 102 in the linear direction 114. Alternatively, the roller bearings could be replaced by air bearings. By way of example, a linear force actuator (or VCM, EI-core) may be used to exert a force Fcs on the cable carrier 106 to overcome cable drag forces Fc. FIG. 4B illustrates a cable carrier 106 that is movably coupled to the surface 118 of the stage 102 via pivot arms 120B. The pivot arms 120B allow the cable carrier 106 to freely swing about the surface 118 of the stage 102 along an arcuate path. For small displacements, the travel is approximately in the linear direction 114. By way of example, a linear actuator or rotary actuator may be used to exert a force on the cable carrier 106 to overcome cable drag forces Fc. As should be appreciated, a linear actuator generally applies a linear force Fcs while a rotary type actuator generally applies a rotary force or moment Mcs.

Figure 4C:
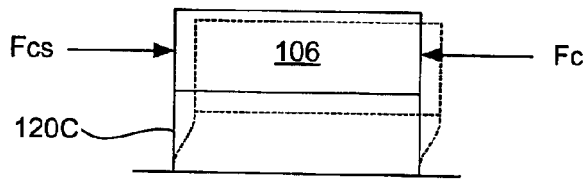
FIG. 4C illustrates a cable carrier that is movably coupled to the surface of the stage via flexures, in accordance with one embodiment of the present invention.
Figure 4D:
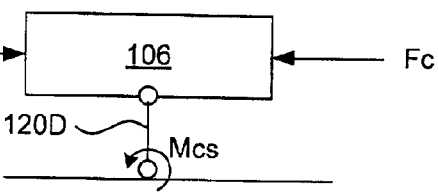
FIG. 4D illustrates a cable carrier that is coupled to the surface of the stage via a single pivot arm, in accordance with one embodiment of the present invention.
Figure 4E:
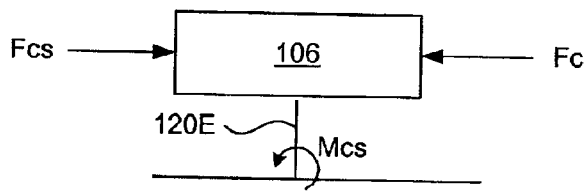
FIG. 4E illustrates a cable carrier that is coupled to the surface of the stage via a single flexure, in accordance with one embodiment of the present invention.

FIG. 4C illustrates a cable carrier 106 that is movably coupled to the surface 118 of the stage 102 via flexures 120C. The flexures 120C allow the cable carrier 106 to translate along the surface 118 of the stage 102 along an approximately arcuate path. For small displacements, the travel is approximately in the linear direction 114. By way of example, a linear actuator may be used to exert a force Fcs on the cable carrier 106 to overcome cable drag forces Fc. A rotary actuator may also be used as in FIG. 4B depending on the flexure design. FIG. 4D illustrates a cable carrier 106 that is coupled to the surface 118 of the stage 102 via a single pivot arm 120D. Like the plural pivot arms, the single pivot arm 120D allows the cable carrier 106 to freely swing about the surface 118 of the stage 102 along an arcuate path and in the linear direction 114. By way of example, a linear actuator or rotary actuator may be used to exert a force Fcs or Mcs respectively, on the cable carrier 106 to overcome cable drag forces Fc. FIG. 4E illustrates a cable carrier 106 that is coupled to the surface 118 of the stage 102 via a single flexure 120E. Like the plural flexures, the single flexure 120E allows the cable carrier 106 to bend about the surface 118 of the stage 102 along an arcuate path and in the linear direction 114. By way of example, a linear actuator or rotary actuator may be used to exert a force Fcs or Mcs respectively, on the cable carrier 106 to overcome cable drag forces Fc.

Figure 5:
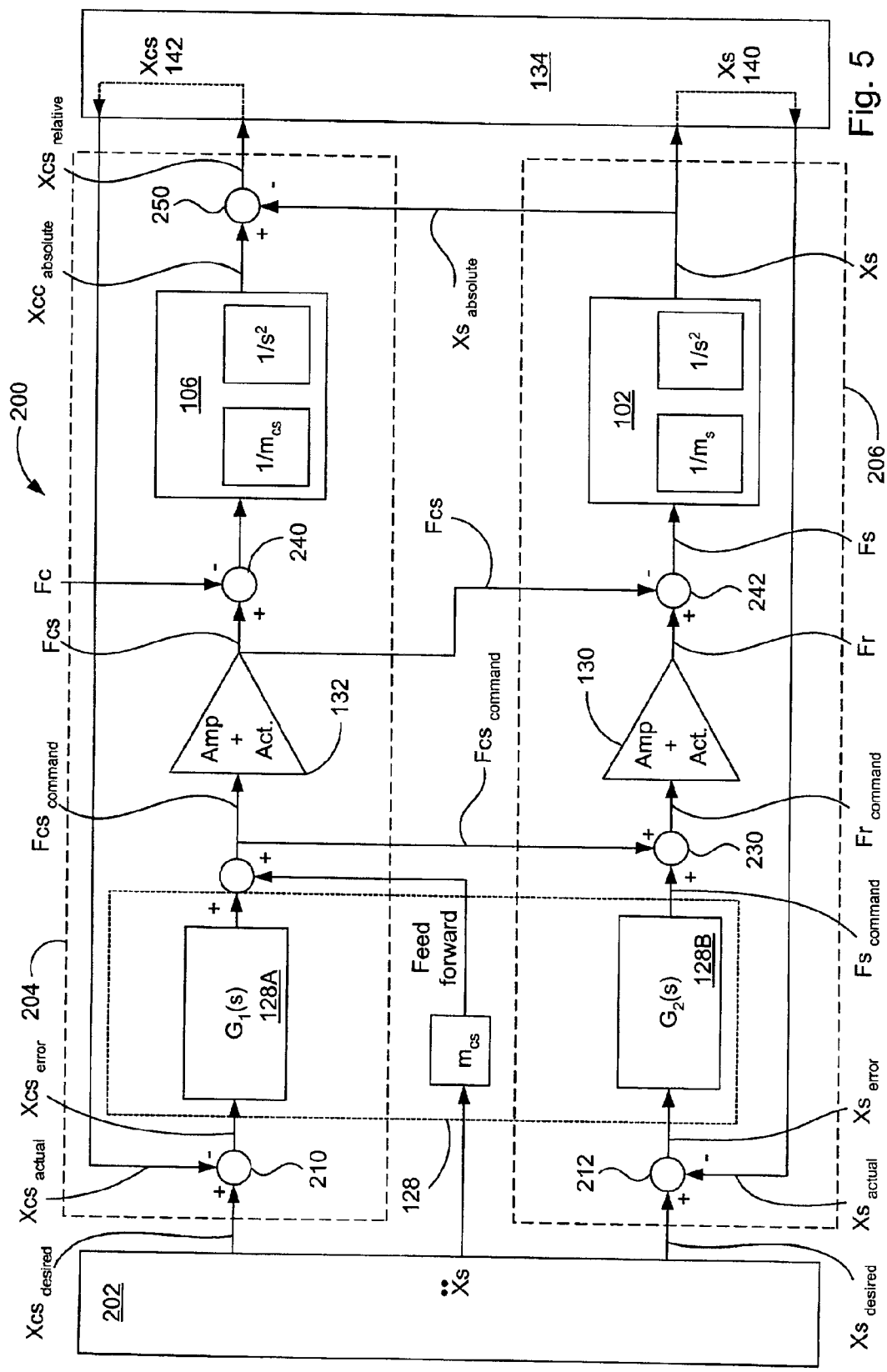
FIG. 5 is a closed loop representation, in block diagram form, of a positioning control circuit that may be used in the stage system to control the positions of the stage and the cable carrier, in accordance with one embodiment of the present invention.

FIG. 5 is a closed loop representation, in block diagram form, of a positioning control circuit 200 that may be used in the stage system 100 to control the positions of the stage 102 and the cable carrier 106, in accordance with one embodiment of the present invention. The positioning control circuit 200 generally includes a trajectory command computer 202, a carrier control loop 204, a stage control loop 206 and a position measuring system 134. With regards to the carrier control loop 204, the carrier control loop 204 includes a carrier controller 128A, a position measurement 142 and a carrier drive unit 132 for moving the cable carrier 106. With regards to the stage control loop 206, the stage control loop 206 includes a stage controller 128B, a position measurement 140, and a stage drive unit 130 for moving the stage 102.

The trajectory command computer 202, which may be a digital signal processor or micro-processor, is configured to generate input command signals corresponding to the desired positions of the stage 102, the cable carrier 106 and the desired acceleration of the stage acceleration $a_s$. In the illustrated embodiment, the desired position of the stage 102 is designated $Xs_{desired}$ and the desired position of the carrier 106 is designated $Xcs_{desired}$. $Xcs_{desired}$ is typically equal to zero. It should be noted, however, that this is not a limitation. The stage position command signal $Xs_{desired}$ is sent to node 212 where it is compared to a signal representing the actual position of the stage 102. The carrier position command signal $Xcs_{desired}$, on the other hand is sent to node 210 where it is compared to signals representing the actual position of the cable carrier 106. In the illustrated embodiment, the actual position of the stage 102 is designated $Xs_{actual}$ and the actual position of the carrier 106 is designated $Xcs_{actual}$. In most cases, the actual positions ($Xs_{actual}$ and $Xcs_{actual}$) are determined by the position measurement system. For example, the actual positions may be determined by interferometers using measuring mirrors 136, 138 (as shown in FIG. 4). Alternatively, the Xcs signal could come from a relative position measurement between the stage and the cable carrier. Furthermore, the difference between the actual positions as measured by the position measurement system and the desired position supplied by trajectory command computer 202 is generally known as the positional error. As such, a stage positional error $Xs_{error}$ is generated at the node 212, and a carrier positional error $Xcs_{error}$ is generated at the node 210.

To elaborate further, the stage positional error signal $Xs_{error}$ is fed to stage controller 128B where a force command signal $Fs_{command}$ relating to the positional error is produced. Similarly, the carrier positional error signal $Xcs_{error}$ is fed to the carrier controller 128A where a force command signal $Fcs_{command}$ relating to the positional error is produced. In most cases, controllers 128A and 128B are computers that use software to generate the control signals (e.g., analog or digital) necessary to control the actuators found in the drive units. By way of example, a proportional integral derivative (PID) controller or a velocity feedback controller may be used. Optionally, a stage acceleration feed forward can be added to the feedback controller output to reduce the variation in Xcs during acceleration. Further, the force command signal $Fcs_{command}$ is sent to both the carrier drive unit 132 and to node 230 and the force command signal $Fs_{command}$ is sent to node 230. At node 230, $Fcs_{command}$ is combined (summed) with the stage force command signal $Fs_{command}$ to produce a resultant force command signal $Fr_{command}$. After the force signals are combined, the resultant force command signal $Fr_{command}$ is sent to the stage drive unit 130. If implemented correctly in software, there should be no time delay between the two force commands traveling to the drive units 130, 132.

Upon receiving the force command signals, the drive units output a force that is applied to their respective components. For example, upon receiving the force command signal Fcs$_{command}$ the drive unit 132 outputs force Fcs that is applied to the cable carrier 106. Also, upon receiving the force command signal Fr$_{command}$ the drive unit 130 outputs force Fr that is applied to the stage 102. It should be noted, that before the command signals are outputted as forces, they typically pass through an amplifier that correspondingly sends power to the actuator. The amplifiers for both drive units should have similar frequency response characteristics to minimize phase differences that may cause disturbance forces on the stage.

For ease of discussion, node 240 represents the forces that act on the cable carrier 106 during position correction, i.e., realignment of Xcs, and node 242 represents the forces that act on the stage 102 during stage movement, i.e., scanning or step and repeat. As shown, the forces that act on the cable carrier 106 include carrier force Fcs and cable drag forces force Fc, and the forces that act on the stage 102 include carrier force Fcs and resultant force Fr. As such, force Fc is subtracted from Fcs at node 240 and force Fcs is substracted from Fr at node 242 thus canceling the effects of the carrier reaction force Fcs. As a result of the canceling, the cable carrier 106 maintains the carrier position Xcs within the desired range and the stage 102 is moved to the desired stage position Xs ($\Sigma$F=Fr−Fcs=Fs) without feeling the effects of the cable drag forces Fc. In essence, the unknown cable drag forces are filtered out by applying an equal and opposite force to the cable carrier and then adding this known force to the desired stage force.

In the illustrated embodiment, the position of the cable carrier and stage are measured relative to the body 112 (as shown in FIG. 2). As such, the position Xcs, which is the position of the carrier relative to the stage, is determined at node 250. That is, at node 250, the absolute position of the cable carrier Xcc$_{absolute}$ (which is positive in this case) is added to the absolute position of the stage Xs$_{absolute}$ (which is negative in this case) thus leaving the relative position Xcs$_{relative}$. (Xcs$_{relative}$=Xcc$_{absolute}$−Xs$_{absolute}$). Alternatively, the position of the cable carrier may be measured relative to the stage thus removing node 250. By way of example, a measurement system for measuring the position of the carrier may be positioned on the stage.

Further, the canceling process continues as long as the stage is moved. For example, as shown at node 250, when the stage 102 moves to position Xs, the carrier 106 may become mis-aligned and thus the process may start over, i.e., the actual position of the carrier is different than the desired position of the carrier and therefore carrier positional error Xcs is produced at node 210. By way of example, when the stage 102 moves in the X+ direction, the carrier 106 may become mis-aligned in the X− direction, and thus in order to maintain the position Xcs, the carrier 106 may move in the X+ direction following misalignment (as shown in FIG. 3). In addition, when the stage 102 moves in the X− direction, the carrier 106 may become mis-aligned in the X+ direction and thus in order to maintain the position Xcs, the carrier 106 may move in the X− direction following misalignment. Moreover, when the stage 102 stops or starts moving, the carrier 106 may become mis-aligned due to the acceleration and deceleration of the stage and thus in order to maintain the position Xcs, the carrier may move in either the X+ or X− direction following misalignment. Feed forward may help because it starts accelerating the cable carrier at the same rate as the stage rather than waiting for an Xcs error to develop.

Figure 6:
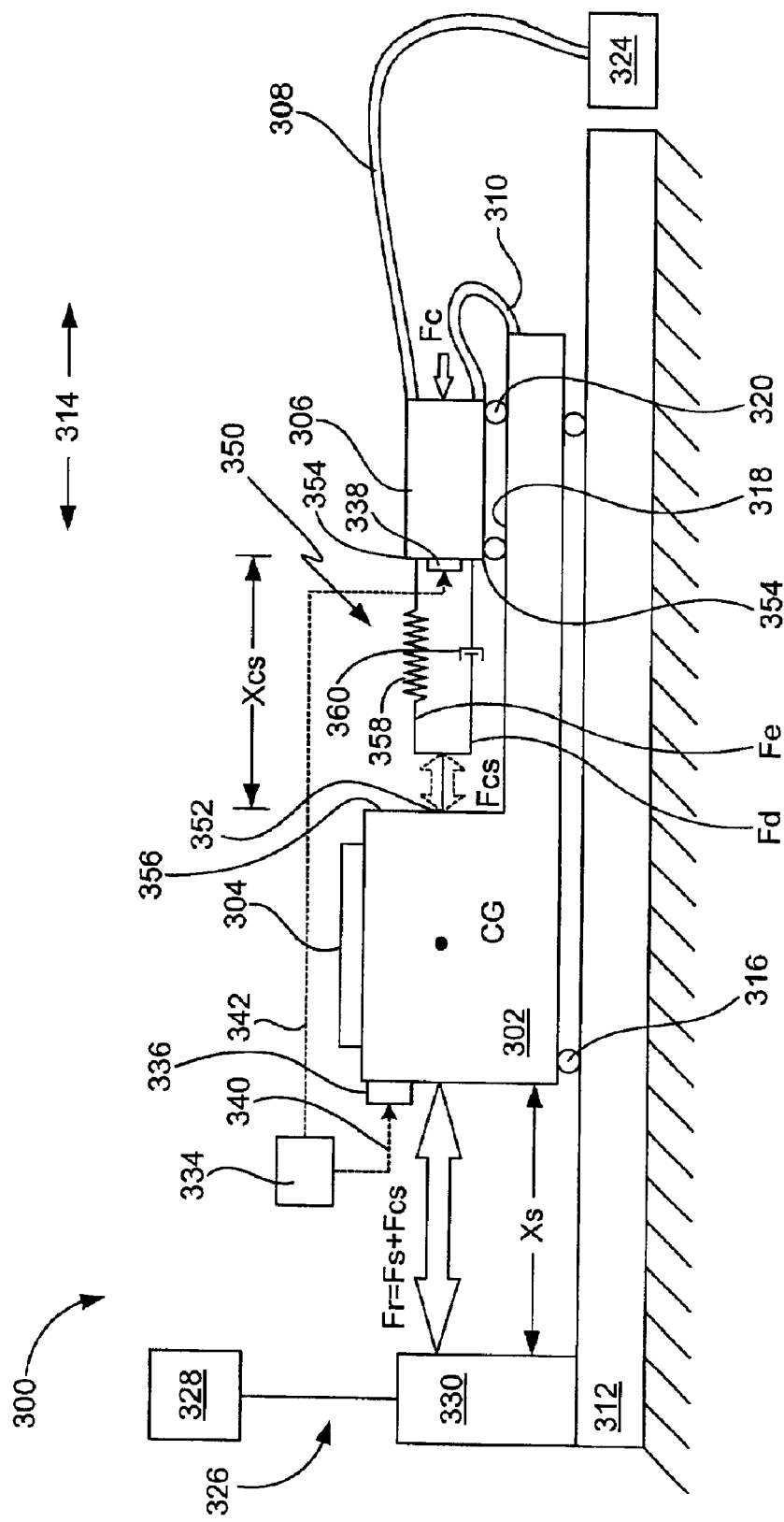
FIG. 6 is a simplified diagram of a stage system, in accordance with another embodiment of the present invention.

FIG. 6 is a simplified diagram of a stage system 300, in accordance with another embodiment of the present invention. The stage system 300 generally includes a stage 302 for carrying a work piece 304 and a cable carrier 306 for carrying a plurality of first cables 308 and a plurality of second cables 310. In this figure, the stage 302 and cable carrier 306, are produced in accordance with the teachings of the invention set forth above with regards to FIG. 4. Thus, the stage 302 is movable relative to a stage body 312, and the cable carrier 306 is movable relative to the stage 302. In most cases, the cable carrier 306 is configured to move independent of the stage 302. Further, both the stage 302 and cable carrier 306 are configured to travel in a linear direction 314 (e.g., X, Y or Z coordinate). As shown, the stage 302 is movably coupled to the stage body 312 (e.g., stage frame) via an anti-friction device 316. By way of example, the anti-friction device 316 may include anti-friction bearings such as air bearings, fluid bearings, roller bearings or the like. Furthermore, the cable carrier 306 is movably coupled to a surface 318 of the stage 302 via a carrier bearing 320. The surface 318 may be a top surface (as shown), a bottom surface or a side surface. In most cases, the carrier bearing 320 is a short stroke one degree of freedom bearing such as roller bearings, air bearings and the like. Other sliders, as well as, pivot arm(s), flexure(s), or the like may also be used.

With regards to the cables, the plurality of first cables 308 are disposed between the cable carrier 306 and an external device 324, and the plurality of second cables 310, which are operatively coupled to the plurality of first cables 308, are disposed between the cable carrier 306 and the stage 302. The first cables 308 have a length that corresponds with the travel of the stage 302, and the second cables 310 have a length that corresponds with the travel of the cable carrier 306. In most cases, the stage travel is larger than the cable carrier travel and therefore the first cables 308 are typically longer than the second cables 310. The external device 324 is typically located external to the stage 302 and may be any component that is used for operating the stage 302 or cable carrier 306. By way of example, the external device 324 may be a power supply, a controller, an air supply, a vacuum generator, a cooling supply, or the like (or any combination thereof). Alternatively, the external device 324 can also be mounted directly to the stage body 312. As should be appreciated, the plurality of first cables and second cables are used to operatively couple the external device 324 to the stage 302. By way of example, the first and second cables 308, 310 may be electrical wires, fiber optic cables, coaxial cables or they may be hoses or tubes including air hoses, vacuum hoses or cooling hoses. It should also be appreciated, that these are not limitations and that the cables 308, 310 and external devices 324 can be anything that is needed to effectively operative the stage 302 or something mounted on the stage 302 such as for example the cable carrier 306.

The stage system 300 also includes a position controller 328 and a stage drive unit 330. The position controller 328 is operatively coupled to the stage drive unit 330. In general, the position controller 328 provides force command signals for driving the stage drive unit 330. For example, the stage drive unit 330, via a stage force command signal, outputs a force Fr for moving the stage 302. Furthermore, the first drive unit 330 generally includes an actuator such as a linear servo-motor, a ball screw motor, a rotary motor or the like.

Moreover, to control the accuracy of the stage system 300, the actual positions of the stage 302 and the cable carrier 306 (e.g., Xs and Xcs) are measured by a position measurement system 334. By way of example, FIG. 6 shows a laser interferometer system that includes measuring mirrors 336, 338 which are attached in the linear direction 314 to a side of the stage 302 and carrier 306, respectively. The mirrors 336, 338 provide reflective surfaces that enable laser interferometer beams 340, 342 to facilitate positioning measurements with respect to the stage 302 and carrier 306. Because interferometers are differential devices, the positions of the stage 302 and cable carrier 306 are generally measured relative to a fixed position of the stage system 300. The fixed position may be the stage 302 (only for carrier 106), stage body 312, some other part of the frame that supports the stage system 300 or some component that is external to the stage system 300. Furthermore, although not shown, the position measurement system 334 is operatively coupled to the position control system 326. The position measurement system 334 typically provides position signals corresponding to the actual positions of the stage 302 and carrier 106 to the position control system 326. As such, the position control system 326, via actual position signals from the position measurement system 334, can determine the positional error related to either the stage 302 and/or the carrier 306.

It should be appreciated that laser interferometers are not a limitation and that a wide variety of other position measurement systems can be used. By way of example, encoder sensors, potentiometer sensors, capacitance sensors, inductive sensors, and the like may also be used to determine the position of the stage and carrier. Position measurement systems are generally well known to those skilled in the art and for the sake of brevity will not be described in greater detail.

The stage system 300 also includes a spring/damper device 350 for supporting the cable carrier 306 in a position Xcs relative to the moving stage 302. As shown, the spring/damper device 350 is disposed between the stage 302 and the cable carrier 306 and centered relative the center of gravity (CG) of the stage 302. A first end 352 of the device 350 is attached to a rigid portion 356 of the stage 302 and a second end 354 of the device 350 is attached to the cable carrier 306. The spring/damper device 350 generally includes a spring element 358 and a damper element 360, both of which are positioned between the first and second ends 352, 354. The spring element 358 and the damper element 360, which is arranged in parallel with the spring element 358, work together to hold the cable carrier 306 in position Xcs. For example, the spring element 358 and damper element 360 produce a resilient force Fcs for maintaining the position Xcs.

To elaborate further, the spring element 358 is arranged to dynamically support the cable carrier in position Xcs by exerting a restoring force Fe on the cable carrier 306. For example, when the cable carrier 306 is displaced to the right, the restoring force Fe is applied to the left, and vice versa. As is well known in the art, the restoring force is equal to $kx_{cs}$, where k is a spring constant whose value depends on the nature of the spring element and where x denotes the displacement of the cable carrier 306 from the position of zero spring deflection. For ease of discussion and not limitation, in the illustrated embodiment, the position of zero spring deflection generally corresponds to when the cable carrier position Xcs is equal to zero. The damper element 360, on the other hand, is arranged to eliminate or progressively diminish oscillations incurred on the cable carrier 306 by exerting a damping force Fd on the cable carrier 306. For example, as the oscillations proceed because of the restoring force, the mechanical energy of the spring/damper device decreases until the cable carrier reaches position Xcs. As is well known in the art, the damping force Fd is equal to $b\dot{x}_{cs}$, where b is a damping constant whose value depends on the nature of the damping element and where $\dot{x}_{cs}$ denotes the velocity of the cable carrier 306. As should be appreciated, the resilient force Fcs is a combination of the restoring force Fe and the damping force Fd (Fcs=Fe+Fd).

Further, the force Fcs is configured to work against the cable drag forces Fc in order to dynamically maintain a cable carrier position Xcs relative to the moving stage 302. By dynamically maintaining, it is meant that during stage acceleration, scan, and deceleration, the carrier 306 oscillates back and forth relative to the stage 302. The spring rate k and damping constant b are chosen in order to sustain position Xcs within a nominal range (e.g., 0–3 mm) during acceleration and deceleration.

In accordance with one aspect of the present invention, the stage system 300 is configured to control the forces acting on the stage 302 and the cable carrier 306 in a manner that allows the stage 302 to move without substantially feeling the effects of the cable drag forces Fc. In essence, k and b are chosen to keep Xcs within a desired range, the Xcs position is used to estimate the Fcs (Fcs=kx+b$\dot{x}$) and the estimated Fcs is added to Fs to get Fr. This cancels the Fcs from the cable carrier and the resultant force Fr cancels the resilient force Fcs that acts on the stage 302 (via the spring/damper device) thus leaving the force Fs to move the stage 302 to the desired position.

In the illustrated embodiment, the stage system 300 is configured to control the forces acting on the stage 302 by estimating the resilient force Fcs acting on the cable carrier 306 (during movement of the stage 302). In this embodiment, relative position and velocity measurements (Xcs and $\dot{x}_{cs}$) are used to estimate the resilient force Fcs. The position measuring system 334 measures the actual position of the cable carrier 306 and sends a position signal to the control system 326. After receiving the position signal, the control system 326 compares the actual position and velocity (i.e., Xcs and $\dot{x}_{cs}$) to a desired carrier position and velocity (in this case zero). If there is any displacement between the actual position and the desired carrier position then the control system 326 estimates the restoring force applied to the cable carrier using the equation F=kx. As should be appreciated, the restoring force can be determined because the displacement x is known (actual position−desired position) and because the spring constant k is known. The control system 326 also estimates the damping force applied to the cable carrier using the equation F=b$\dot{x}$. As should be appreciated, the damping force can be determined because the displacement relative to time is known and therefore the velocity is known (displacement divided by time) and because the damping constant b is known. Once the restoring force and damping force are estimated, a resilient force command signal having a restoring force component and a damping force component is sent to the stage drive unit 330.

In addition to measuring the position of the cable carrier 306, the position measuring system 334 also measures the actual position of the stage 302 and sends a position signal to the control system 326. If there is any deviation between the actual position and the desired stage position then the control system 326 adds the resilient force command signal to a stage force command signal and the resultant command signal is sent to the stage drive unit 330. After receiving the resultant force command signal, the stage unit 330 outputs the force Fr, which is the combination of Fcs and Fs, to move the stage to the desired stage position. As should be appreciated, the resilient force Fcs is combined with the stage force Fs in order to cancel the force effects of the moving carrier on the moving stage.

Although not shown herein in detail, the sum of the forces with regards to the carrier shown in FIG. 6 is generally provided by the equation $\Sigma F = Fcs - Fc = m_c(\ddot{X}cs + \ddot{X}s)$, where Fc and Fcs are the forces of the cables and carrier, respectively, $m_c$=the mass of the carrier, $\ddot{X}s$=the acceleration of the stage, and $\ddot{X}cs$=the acceleration of the carrier. In this particular embodiment, however, $Fcs = -kXcs - b\dot{x}_{cs}$ and thus the equation may be modified to $\Sigma F = -kXcs - b\dot{x}_{cs} - Fc = m_c\ddot{X}cs + m_c\ddot{X}s$ and further to $m_c\ddot{X}cs + b\dot{x}_{cs} + kXcs = -Fc - m_c\ddot{X}s$.

In order to select a "k" and a "b" for keeping Xcs with a desired range, the equation can be further modified to:

$$Xcs(s) = (-m_c s^2/(m_c s^2 + bs + k))Xs - (1/(m_c s^2 + bs + k))Fc$$

Furthermore, the following equation illustrates how the sensors may be used to calculate Fcs and increase Fr:

$$Fcs = kXcs + b\dot{x}_{cs}$$

Figure 7:
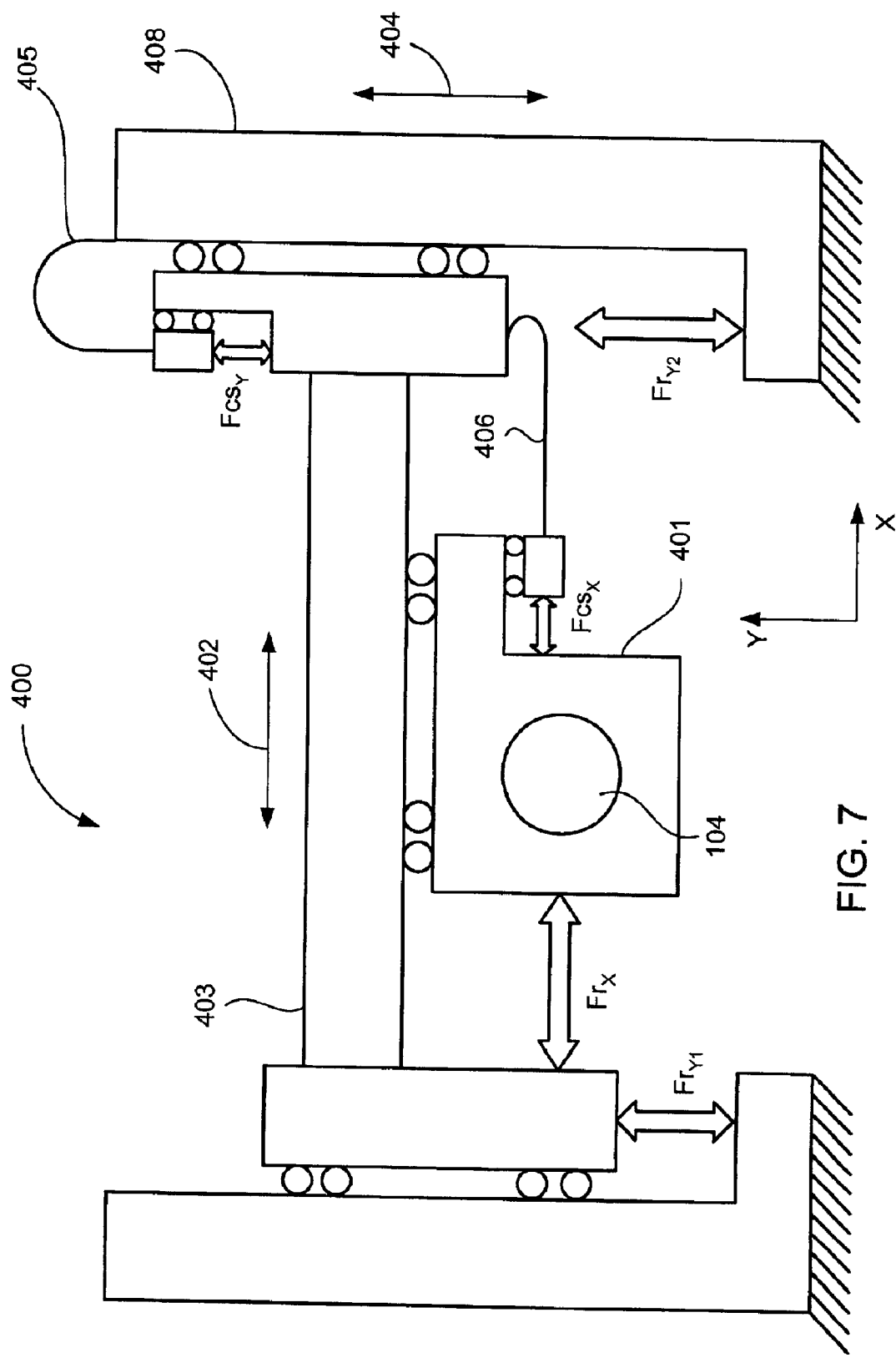
FIG. 7 is a simplified diagram of a planar stage, in accordance with one embodiment of the present invention.

FIG. 7 is a simplified diagram of a planar stage 400, in accordance with one embodiment of the present invention. In this embodiment, a first stage system 401 is used to move the work piece 104 in a first linear direction 402 and a second stage system 403 is used to move the work piece 104 in a second linear direction 404. As shown, the first direction 402 is orthogonal to the second direction 404. By way of example, the first direction 402 may correspond to the X direction and the second direction 404 may correspond to the Y direction. Further, a plurality of first cables 405 are coupled between an external device 408 and the second stage 403, and a plurality of second cables 406 are coupled between the second stage 403 and the first stage 401. In one embodiment, the first and second stages 401, 403 are produced in accordance with the teachings of the invention set forth above with regards to FIG. 2. In another embodiment, the first and second stages 401, 403 are produced in accordance with the teachings of the invention set forth above with regards to FIG. 6.

Figure 8:
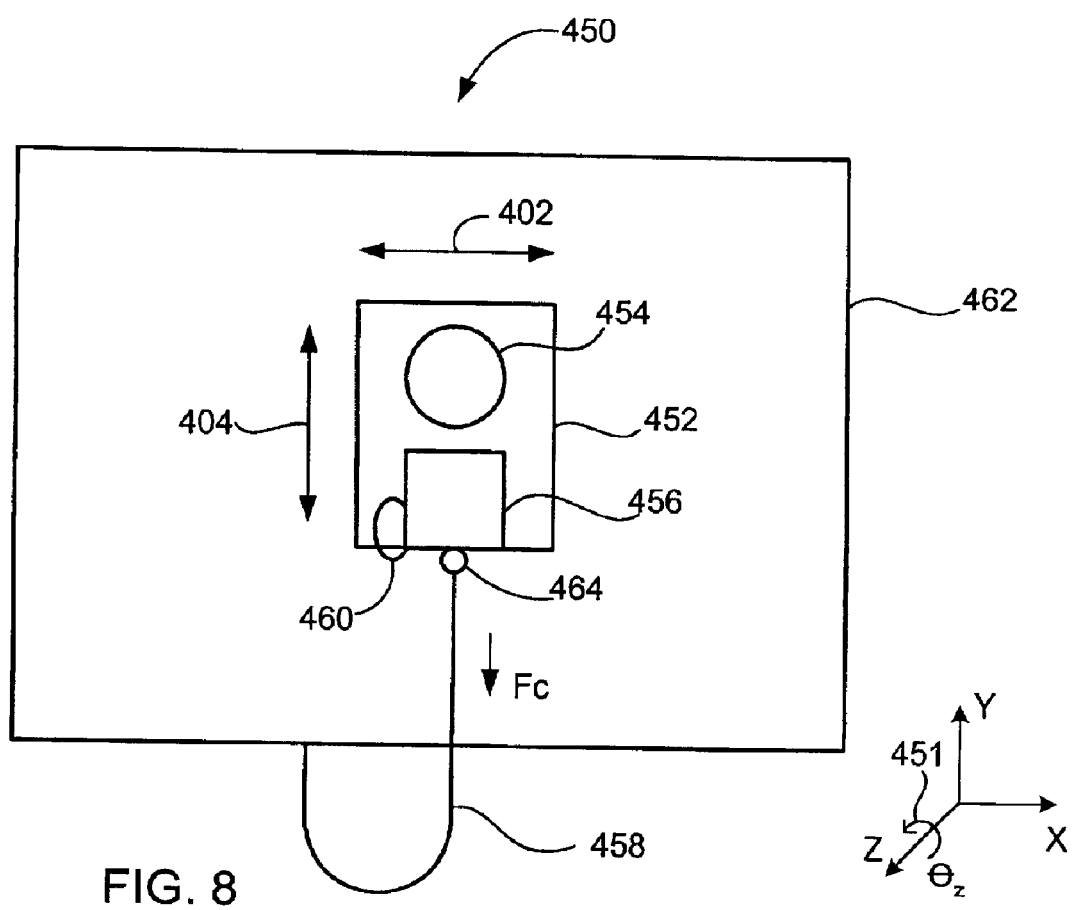
FIG. 8 is a simplified diagram of a planar stage, in accordance with one embodiment of the present invention.

FIG. 8 is a simplified diagram of a planar stage system 450, in accordance with another embodiment of the present invention. The stage system 450 generally includes a stage 452 for carrying a work piece 454 and a cable carrier 456 for carrying a plurality of first cables 458 and a plurality of second cables 460. The stage 452 is movable relative to a stage body 462, and the cable carrier 456 is movable relative to the stage 452. In most cases, the cable carrier 456 is configured to move independent of the stage 452. Further, both the stage 452 and cable carrier 456 are configured to travel in at least two directions, as for example the X direction 402 and the Y direction 404. Further still, the stage system 450 includes a cable pivot 464 for allowing the plurality of cables 458 to swing relative to the cable carrier 454. The cable pivot 464 is located at the connection between the plurality of first cables 458 and the cable carrier 456. Further, the plurality of second cables 460 are coupled between the cable carrier 454 and the stage 452.

Although not shown, a position control system configured for controlling the positions of both the stage 452 and the cable carrier 456 is also provided. The position control system generally consists of a position controller and separate X-Y-θ motors for moving the stage 452 and carrier 456 in directions 402, 404, 451. More particularly, a first X-Y-θ motor is used to move the stage 452 and a second X-Y-θ motor is used to move the carrier 456. X-Y-θ motors for moving stages are generally well known and for the sake of brevity will not be described in detail. In general, the position controller provides force command signals for driving the X-Y-θ motors. For example, the first X-Y-θ motor, via a stage force command signal, outputs a force Fs and torque $\tau_s$ for moving the stage 452, and the second X-Y-θ motor, via a carrier force command signal, outputs a force Fcs and torque $\tau_{cs}$ for moving the carrier 456. As should be appreciated, force Fs includes both an X component Fsx and a Y component Fsy, and force Fcs includes both an X component Fcsx and a Y component Fcsy. In most cases, force Fsx and Fsy are the forces required to move the stage 452 to a desired position (Xs, Ys). Similarly, force Fcsx and Fcsy are the forces required to move the cable carrier 456 to a cable carrier position (Xcs, Ycs) relative to the moving stage 452. Also, torques $\tau_s$ and torque $\tau_{cs}$ to move each to the correct yaw angle θ.

Moreover, to control the accuracy of the stage system 450, the actual positions of the stage 452 (e.g., Xs, Ys and θs) and the cable carrier 456 (e.g. Xcs, Ycs and θcs) are measured by a position measurement system. By way of example, a laser interferometer system that includes measuring mirrors may be used. In this particular embodiment, measuring mirrors are attached to the sides of the stage 452 and carrier 456 in both directions 402 and 404. For example, a first mirror may be provided in the first direction 402 and a second mirror may be provided in the second direction 404. The mirrors provide reflective surfaces that enable laser interferometer beams to facilitate positioning measurements (X, Y, θ) with respect to the stage 452 and carrier 456. Because interferometers are differential devices, the positions of the stage 452 and cable carrier 456 are generally measured relative to a fixed position of the stage system 450. Furthermore, the position measurement system is operatively coupled to the position control system. The position measurement system typically provides position signals corresponding to the actual positions of the stage 452 (Xs, Ys and θs) and carrier 456 (Xcs, Ycs and θcs) to the position control system. As such, the position control system, via actual position signals from the position measurement system, can determine the positional error related to either the stage 452 and/or the carrier 456.

In accordance with one aspect of the present invention, the stage system 450 is configured to control the forces acting on the stage 452 and the cable carrier 456 in a manner that allows the stage 452 to move without substantially feeling the effects of the cable drag forces Fc and torque $\tau_c$. Broadly, the carrier force Fcs and torque $\tau_{cs}$ is applied to the cable carrier 456 to overcome the cable drag forces Fc and torque $\tau_c$, and resultant force Fr and torque $\tau_r$, which are the combinations of the carrier force Fcs and torque $\tau_{cs}$ and the stage force Fs and torque $\tau_s$, are applied to the stage 452 to the overcome the effects of the force Fcs and torque $\tau_{cs}$. More specifically, the carrier force Fcsx, Fcsy and toque $\tau_{cs}$ are applied to the cable carrier 456 to over come the pivoting cable drag forces Fc and torque $\tau_c$, and both a resultant force Frx, Fry and $\tau_r$, are applied to the stage 452 to the overcome the effects of the force Fcsx, Fcsy and torque $\tau_{cs}$. As should be appreciated, the the resultant force Frx is a combination of the carrier force Fcsx and the stage force Fsx, and the resultant force Fry is a combination of the carrier force Fcsy and the stage force Fsy. In addition, torque $\tau_r$ is a combination of torque $\tau_{cs}$ and torque $\tau_{cs}$. In effect, the carrier force Fcs and torque $\tau_{cs}$ counters the "unknown" cable drag forces Fc that act on the stage 452 and/or cable carrier 456, and the resultant force Fr and torque $\tau_r$ cancel the "known" carrier force Fcs and torque $\tau_{cs}$ that now acts on the stage 452 thus leaving the force Fs and torque $\tau_s$ to move the stage 452 to the desired position.

In one embodiment, the stage system 450 is configured to control the forces acting on the stage 452 and carrier 456 by using position feedback from the position measuring system. In this embodiment, the position measuring system measures the actual position of the cable carrier 456 in the 402, 404 and 451 directions and sends position signals corresponding to these positions to the control system. After receiving the position signals, the control system compares the actual positions to the desired carrier positions. For example, X actual is compared to X desired and Y actual is compared to Y desired. If there is any deviation between the actual position and the desired carrier position then the control system sends a force and torque command signal to the carrier's X-Y-θ motor. The force and torque command signal may include an X component, a Y component and/or a θ component. By way of example, deviations in the cable carrier position may occur when stage force Fs is applied to the stage 452 to accelerate, scan, or decelerate the stage 452. After receiving the force command signal, the carrier X-Y-θ motor outputs the force Fcs, which may include components Fcsx, Fcsy, and/or moment $\tau_{cs}$ to move the cable carrier 456 to the desired carrier position Xcs, Ycs and/or $\theta_{cs}$.

To elaborate further, the "known" force Fcs is configured to work against the "unknown" cable drag forces Fc in order to dynamically maintain cable carrier positions Xcs and Ycs relative to the moving stage 452. By dynamically maintaining, it is meant that during stage acceleration, scan, and deceleration, the carrier 456 oscillates back and forth (X and Y directions) in order to sustain position Xcs, Ycs and θcs within a nominal range (e.g., 0–3 mm and±1 degree, respectively). During these oscillations, the force Fcs and torque $\tau_{cs}$ are configured to overcome the cable drag forces Fc and torque $\tau_c$ to move the cable carrier to position Xcs, Ycs and/or θcs, and therefore the cable drag forces Fc, which act opposite to the vectorial combination of force Fcs (Fcsx+Fcsy), are effectively canceled. As should be appreciated, using the above mentioned technique, the cable drag forces Fc are isolated from the stage 452 without determining their actual value.

In addition to measuring the position of the cable carrier 456, the position measuring system also measures the actual positions of the stage 452 in the 402, 404 and 451 directions and sends position signals corresponding to these positions to the control system. If there is any deviation between the actual position and the desired stage position then the control system adds the carrier command signal to a stage force/torque command signal and the resultant command signal is sent to the stage's X-Y-θ motor. The force/torque command signal may include both an X component, a Y component and/or θ component. After receiving the resultant force/torque command signal, the stage unit 130 outputs the force Fr, which is the combination of Fcs and Fs, and $\tau_r$, which is the combination of $\tau_{cs}$ and $\tau_s$ to move the stage 452 to the desired stage position Xs, Ys and/or θs. As should be appreciated, the carrier force Fcs and torque $\tau_{cs}$ are combined with the stage force Fs and torque $\tau_s$, respectively, in order to cancel the force effects of the moving carrier on the moving stage.

Figure 9A:
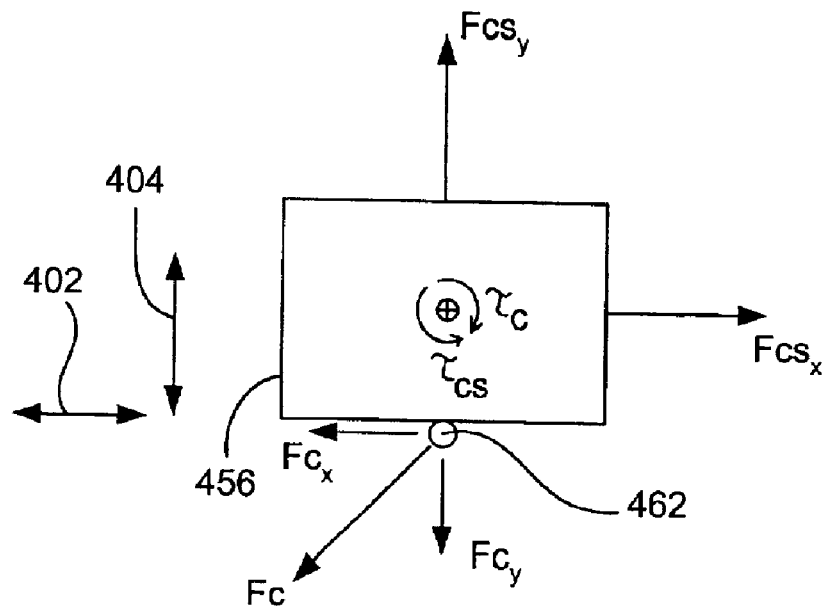
FIG. 9A is a free body diagram illustrating the forces acting on the cable carrier of FIG. 8, in accordance with one embodiment of the present invention.
Figure 9B:
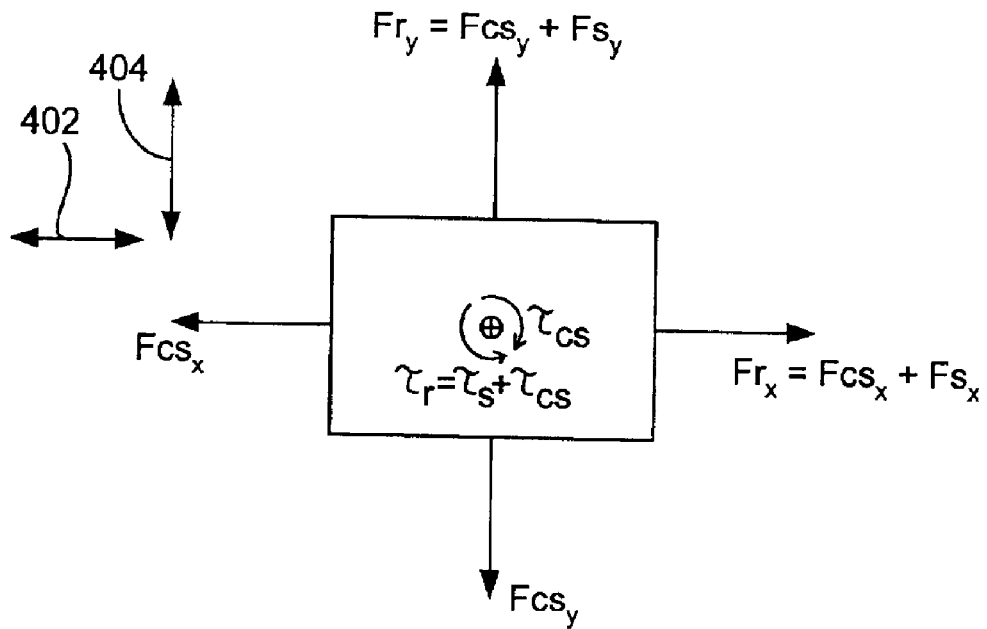
FIG. 9B is a free diagram illustrating the forces acting on the stage of FIG. 8, in accordance with one embodiment of the present invention.

To facilitate discussion, FIG. 9A is a free body diagram illustrating the forces and torques acting on the cable carrier 456 during movement of the stage 452, and FIG. 9B is a free body diagram illustrating the forces acting on the stage 452 during movement of the stage 452. As is generally well known, the purpose of a free body diagram is to evaluate the resultant of all actual forces acting on a body in question. In these diagrams, it is assumed that the stage 452 and carrier 456 move with negligible friction.

With regards to FIG. 9A, in order to maintain position Xcs, Ycs and θ, the force and torque exerted on the cable carrier 456 by the cables, plus the force/torque required to accelerate the cable carrier is equal to the forces and torque exerted on the cable carrier 456 by the carrier's X-Y-θ motor. The sum of the forces in the X direction are generally provided by the equation $\Sigma F_x = Fcs_x - Fc_x = m_c(\ddot{X}cs + \ddot{X}s)$, where $Fcs_x$ and $Fc_x$ are the vectorial forces of the carrier and cables, respectively, $m_c$ is the mass of the carrier, $\ddot{X}cs$ is the acceleration of the carrier, and $\ddot{X}s$ is the acceleration of the stage. The sum of the forces in the Y direction are generally provided by the equation $\Sigma F_y = Fcs_y - Fc_y = m_c(\ddot{Y}cs + \ddot{Y}s)$, where $Fcs_y$ and $Fc_y$ are the vectorial forces of the carrier and cables, respectively, $m_c$ is the mass of the carrier, $\ddot{Y}cs$ is the acceleration of the carrier, and $\ddot{Y}s$ is the acceleration of the stage. The sum of the forces in the θ direction are generally provided by the equation $\Sigma\tau = \tau cs - \tau c = I_c(\theta cs + \theta s)$, where τcs and τc are the torques of the carrier and cables, respectively, $I_c$ is the moment of inertia of the carrier, θcs is the angular acceleration of the carrier, and θs is the angular acceleration of the stage. In equilibrium, the vectoral combination of the forces Fcs in the X and Y directions is equal to the vectoral combination of the forces Fc and the torque τcs is equal to the torque τc.

With regards to FIG. 9B, in order to maintain the desired force Fs for moving the stage 452, a resultant force Fr, which includes force Fs and Fcs, and a resultant torque τr, which includes torques τs and τcs, are applied to the stage 452 by the stage's X-Y-θ motor to cancel the force Fcs and torque τcs exerted on the stage 452 by the moving cable carrier 456. The sum of the forces in the X direction are generally provided by the equation $\Sigma F_x = Fs_x + Fcs_x - Fcs_x = Fs_x = m_s\ddot{X}_s$, where $Fcs_x$ and $Fs_x$ are the vectorial forces of the reaction force and stage, respectively, $m_s$ is the mass of the stage, and $\ddot{X}s$ is the acceleration of the stage. The sum of the forces in the Y direction are generally provided by the equation $\Sigma F_y = Fs_y + Fcs_y - Fcs_y = Fs_y = ms\,\ddot{Y}s$, where $Fs_y$ and $Fcs_y$ are the vectoral forces of the stage and reaction force, respectively, ms is the mass of the stage, and $\ddot{Y}s$ is the acceleration of the stage. The sum of the forces in the θ direction are generally provided by the equation $\Sigma\tau = \tau s + \tau cs - \tau cs = \tau s = I_s\theta_s$, where τs and τcs are the torques of the stage and reaction torque, respectively, Is is the moment of inertia of the stage, and θs is the angular acceleration of the stage.

Figure 10:
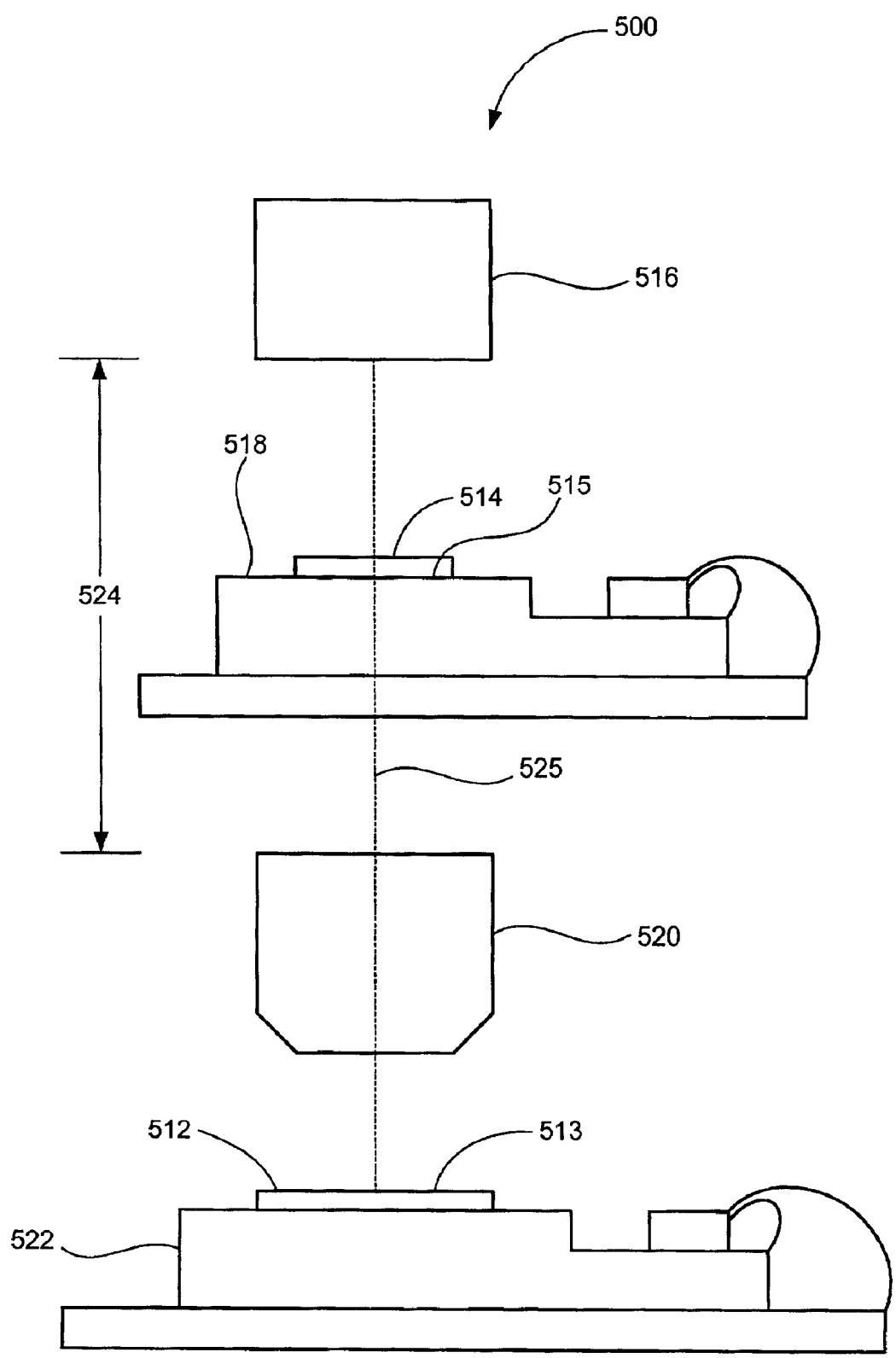
FIG. 10 is a simplified diagram of an electron beam projection lithography system, in accordance with one embodiment of the present invention.

FIG. 10 is a simplified diagram of an electron beam projection lithography system 500, in accordance with one embodiment of the present invention. The lithography system 500 is arranged for writing a circuit image on the surface of a wafer 512 by projecting a beam through a patterned reticle 514. The dimensions of various components are exaggerated to better illustrate the components of this embodiment. As shown, the lithography system 500 includes an illuminator 516, a reticle stage 518, a projector 520 and a wafer stage 522. In general, the illuminator 516 both generates an electron beam and directs the electron beam to the surface of the reticle 514, and the projector 520 both collects transmitted electron beams and projects the transmitted electron beam to the surface of the wafer 512. Although not shown, the illuminator 516 typically includes an electron source and an illumination lens assembly that work together to make the electron beam incident on the reticle and to sweep the electron beam in the Y-direction. In addition, the projector 520 typically includes a projection lens assembly for reducing the size of the transmitted electron beam so as to form the electronic circuit of final size onto the wafer 512.

Furthermore, the reticle stage 518 is positioned within a gap 524 defined between the illuminator 516 and the projector 520, and the wafer stage 522 is positioned below the projector 520. Both stages are arranged for moving within a single plane and relative to the axis 525. That is, the stages move in both the x and y directions. The reticle stage 518 is configured to move the reticle 514 so that all or any selected part of the reticle surface 515 is scanned by the electron beam. Although not shown, the reticle stage 518 may be arranged to accommodate multiple reticles, e.g., two or three reticles, which may include complementary patterns of an entire chip circuit which is to be formed on the wafer 512. The wafer stage 522, on the other hand, is configured to move the wafer 512 so that the scanned reticle surface 515 is printed on all or any selected part of the wafer surface 513. More particularly, electrons that pass through the reticle 514 during reticle stage 518 movement are projected onto the wafer 512 during wafer stage 522 movement such that a pattern defined by the reticle 514 is formed on the wafer 512. In most cases, the wafer stage 522 moves in an opposite direction relative to the reticle stage 518.

In one embodiment, the reticle stage 518 and the wafer stages 522 are produced in accordance with the teachings of the invention set forth above with regards to FIG. 2. In another embodiment, the reticle stage 518 and the wafer stages 522 are produced in accordance with the teachings of the invention set forth above with regards to FIG. 6. In another embodiment, the reticle stage 518 and the wafer stages 522 are produced in accordance with the teachings of the invention set forth above with regards to FIG. 8 or 9. In this embodiment, the stages 518 and 522 arranged to move in a serpentine fashion. For example, the stage scans in one direction, e.g., along the X-axis (into and out of the page), and steps in another direction, e.g., along the Y-axis. In other embodiments, only the the reticle stage 518 is produced in accordance with the teachings of the invention set forth above with regards to FIGS. 2, 6, 8 or 9. In other embodiments, only the the wafer stage 522 is produced in accordance with the teachings of the invention set forth above with regards to FIGS. 2, 6, 8 or 9.

Moreover, although FIG. 10 was described in context of an electron beam projection lithography system, it should be understood that this is not a limitation and that other systems such as optical lithography systems or inspection systems may be used.

While this invention has been described in terms of several preferred embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A high precision stage system, comprising:
   a moveable stage;
   a cable carrier movably coupled to the stage; and
   a control system for controlling the positions of the stage and cable carrier so as to prevent cable drag forces from acting on the stage wherein the control system includes:
      a first drive unit that outputs a stage force for moving the stage, and
      a spring/damper device for supporting the cable carrier in a predetermined carrier position relative to the moving stage wherein the spring/damper device forms a resilient force for maintaining the predetermined carrier position relative to the stage wherein the resilient force is configured to overcome the cable drag forces acting on the cable carrier, and wherein a resultant force, which is the combination of the resilient force and the stage force, is applied to the stage to overcome the effects of the resilient force.

2. The stage system as recited in claim 1 further including a position measurement system for determining the actual positions of the stage and cable carrier.

3. The stage system as recited in claim 2 wherein the position measurement system includes a laser interferometer, encoder sensors, potentiometer sensors, capacitance sensors, or inductance sensors.

4. The stage system as recited in claim 1 wherein the spring/damper device includes a spring element and a damper element.

5. The stage system as recited in claim 1 wherein the stage system is used in a planar stage.

6. The stage system as recited in claim 1 wherein the stage system is used in a semiconductor processing system.

7. The stage system as recited in claim 1 wherein the surface is top surface, side surface or bottom surface.

8. A method for preventing cable drag forces from acting on a stage, the method being embodied in a computer readable media having computer readable instructions for executing the operations of:
   providing a cable carrier that is movably coupled to the stage, the cable carrier being configured for carrying a cable that is operatively coupled to a device external to the stage;
   applying a first force to the cable carrier so as to cancel the cable drag forces acting on the cable carrier;
   applying a second force to the stage so as to move the stage and to cancel the first force acting on the stage;
   providing a control system for outputting the first and second forces, and a position measuring system for determining the positions of the stage and cable carrier;
   measuring an actual position of the cable carrier and the stage with the position measurement system; and
   sending positional signals associated with the actual positions of the stage and cable carrier to the control system;
   comparing the actual position of the stage to a desired position of the stage;
   comparing the actual position of the cable carrier to a desired position of the cable carrier;
   generating a stage force command signal if there is a difference between the actual position of the stage and the desired position of the stage;
   generating a carrier force command signal if there is a difference between the actual position of the carrier and the desired position of the carrier;
   sending the carrier force command signal to a first drive unit;
   combining the carrier force command signal with the stage force command signal; and
   sending the combined force command signal to a second drive unit.

9. The method as recited in claim 8 wherein the computer readable instructions enable the operation of determining the first and second forces using the positional signals from the position measuring system.

10. The method as recited in claim 8 wherein the computer readable instructions enable the operation of the first drive unit to apply the first force to the cable carrier via the carrier force command signal, and wherein the second drive unit applies the second force to the stage via the combined command signal.

11. A method for preventing cable drag forces from acting on a stage, the method being embodied in a computer readable media having computer readable instructions for executing the operations of:

providing a cable carrier that is movably coupled to the stage, the cable carrier being configured for carrying a cable that is operatively coupled to a device external to the stages;

applying a first force to the cable carrier so as to cancel the cable drag forces acting on the cable carrier;

applying a second force to the stage so as to move the stage and to cancel the first force acting on the stage;

providing a control system for outputting the first and second forces, and a position measuring system for determining the position of the stage and cable carrier;

measuring an actual position of the cable carrier and the stage with the position measurement system;

sending positional signals associated with the actual positions of the stage and cable carrier to the control system;

comparing the actual position of the stage to a desired position of the stage;

generating a first stage force command signal if there is a difference between the actual position of the stage and the desired position of the stage;

estimating the first force by comparing the actual position of the cable carrier to a desired position of the cable carrier;

generating a second stage force command signal that is based on the estimated first force;

combining the first stage force command signal with the second stage force command signal; and sending the combined force command signal to a first drive unit, wherein the first drive unit applies the second force to the stage via the combined command signal.

12. The method as recited in claim 11 further comprising computer readable instructions enabling the operation of:

providing a spring/damper device that is configured to apply the first force to the cable carrier.

* * * * *